United States Patent
Plug (10) Patent No.: US 7,113,253 B2
(45) Date of Patent: Sep. 26, 2006

(54) METHOD, APPARATUS AND COMPUTER PRODUCT FOR SUBSTRATE PROCESSING

(75) Inventor: Reinder Teun Plug, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 384 days.

(21) Appl. No.: 10/662,881

(22) Filed: Sep. 16, 2003

(65) Prior Publication Data

US 2005/0058446 A1    Mar. 17, 2005

(51) Int. Cl.
*G03B 27/32* (2006.01)
*G03B 27/42* (2006.01)
*G03D 5/00* (2006.01)
*B05C 11/00* (2006.01)
*G06F 19/00* (2006.01)

(52) U.S. Cl. .......................... 355/27; 355/53; 396/611; 118/696; 118/697; 118/698; 700/121

(58) Field of Classification Search .................. 355/27, 355/53; 396/611; 414/222.13, 273, 935; 716/1; 702/179, 199; 700/95, 108, 114, 700/121; 118/696, 697, 698
See application file for complete search history.

(56) References Cited

U.S. PATENT DOCUMENTS

| | | | | |
|---|---|---|---|---|
| 5,668,733 | A | * 9/1997 | Morimoto et al. | 716/19 |
| 6,268,900 | B1 | * 7/2001 | Iwatsu | 355/27 |
| 6,799,910 | B1 | * 10/2004 | Tateyama | 396/611 |
| 2002/0155727 | A1 | * 10/2002 | Narita et al. | 438/758 |

* cited by examiner

*Primary Examiner*—Alan Mathews
(74) *Attorney, Agent, or Firm*—Pillsbury Winthrop Shaw Pittman LLP (57) ABSTRACT

A method, apparatus and computer product for processing of substrates in at least a part of a substrate processing system is provided. In an embodiment, the method includes obtaining, using a processing unit, at least one of a rate of processing and a time of processing of a plurality of substrate lots to be introduced into a part of the substrate processing system and determining, using the processing unit, an order of introduction of the plurality of substrate lots into the part of the substrate processing system to at least one of increase the rate of processing and decrease the time of processing of the plurality of substrate lots.

26 Claims, 4 Drawing Sheets

METHOD, APPARATUS AND COMPUTER PRODUCT FOR SUBSTRATE PROCESSING

FIELD

The present invention relates to processing of substrates in a substrate processing system.

BACKGROUND

The term "patterning device" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning devices include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning device can comprise one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference. In the case of a programmable mirror array, the said support structure may be embodied as a frame or table, for example, which may be fixed or movable as required; and A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as hereabove set forth.

Lithographic apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic apparatus, each target portion is irradiated by exposing the entire mask pattern onto the target portion at one time; such an apparatus is commonly referred to as a wafer stepper or step-and-repeat apparatus. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and PCT patent application WO 98/40791, both incorporated herein by reference.

In a substrate processing system (an embodiment of which is sometimes known as a lithography cell), typically comprising a lithographic apparatus and a track, multiple substrates (wafers) are processed. Such substrates are processed in lots, each lot usually having up to 50 substrates. At any one point in time, there may be a plurality of lots in the substrate processing system. Furthermore, a recipe is associated with each lot, the recipe defining, among other things, the process steps, equipment, material and timing applicable to the substrate(s) of the lot, such as the mask to be used, the resist type to be applied, the exposure dose, etc. So, with multiple lots in the substrate processing system, there may also be multiple recipes to be used in the substrate processing system. For example, at any one point in time, a substrate processing system can have between 30 and 50 substrates being processed in the system, which typically includes 4–6 lots. Continuing with this example, while several lots of the 4–6 lots may have the same recipe, a number may have different recipes. In current substrate processing systems, lots are processed in a first-come first-served manner, meaning that each lot is processed in turn as it is provided to the substrate processing system, including changing any settings and/or configurations (hereinafter setup) of a part of the substrate processing system as needed for the recipe of the first-come first-served lot.

A problem that has been identified is that when multiple lots are processed in a substrate processing system, a number of those lots may be of a recipe type A and a number of those lots may be of recipe type B, each recipe type requiring a specific substrate processing system setup. To change the setup from type A to type B often requires time in which the substrate processing system is typically not productive. Further, some substrate processing equipment, such as tracks, typically run at the slowest rate of processing of the different types of lots present in the substrate processing system. In each circumstance, bottlenecks may develop which can slow down and even stop substrate processing. The result is that the rate and/or time of processing of a number of substrate lots in the substrate processing system can be negatively impacted, which can lead to lower productivity of the substrate processing system. Thus, it would be advantageous to improve the performance of processing of substrates in a substrate processing system.

SUMMARY

According to an aspect of the invention, there is provided a method for processing of substrates in at least a part of a substrate processing system, comprising:

obtaining, using a processing unit, at least one of a rate of processing and a time of processing associated with a plurality of substrate lots to be introduced into a part of the substrate processing system; and determining, using the processing unit, an order of introduction of the plurality of substrate lots into the part of the substrate processing system to at least one of increase the rate of processing and decrease the time of processing of the plurality of substrate lots.

An increase of productivity of a substrate processing system can be achieved through appropriate ordering of substrate lots in the substrate processing system to increase the rate of processing and/or decrease the time of processing of the lots in the substrate processing system.

According to a further aspect of the invention, there is provided a computer program product for processing of substrates in at least a part of a substrate processing system, comprising:

software code configured to obtain at least one of a rate of processing and a time of processing associated with a plurality of substrate lots to be introduced into a part of the substrate processing system; and software code configured to determine an order of introduction of the plurality of substrate lots into the part of the substrate processing system to at least one of increase the rate of processing and decrease the time of processing of the plurality of substrate lots.

According to a further aspect of the invention, there is provided a lithographic apparatus comprising:

an illuminator configured to provide a projection beam of radiation;

a support structure configured to hold a patterning device, the patterning device configured to pattern the projection beam according to a desired pattern;

a substrate table configured to hold a substrate;

a projection system configured to project the patterned beam onto a target portion of the substrate; and a processing unit configured to obtain at least one of a rate of processing and a time of processing associated with a plurality of substrate lots to be introduced into a part of a substrate processing system and to determine an order of introduction of the plurality of substrate lots into the part of the substrate processing system to at least one of increase the rate of processing and decrease the time of processing of the plurality of substrate lots.

According to a further aspect of the invention, there is provided a track comprising:

a coater configured to apply a layer of radiation-sensitive material to a substrate;

a developer configured to develop an exposed substrate; and a processing unit configured to obtain at least one of a rate of processing and a time of processing associated with a plurality of substrate lots to be introduced into a part of a substrate processing system and to determine an order of introduction of the plurality of substrate lots into the part of the substrate processing system to at least one of increase the rate of processing and decrease the time of processing of the plurality of substrate lots.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
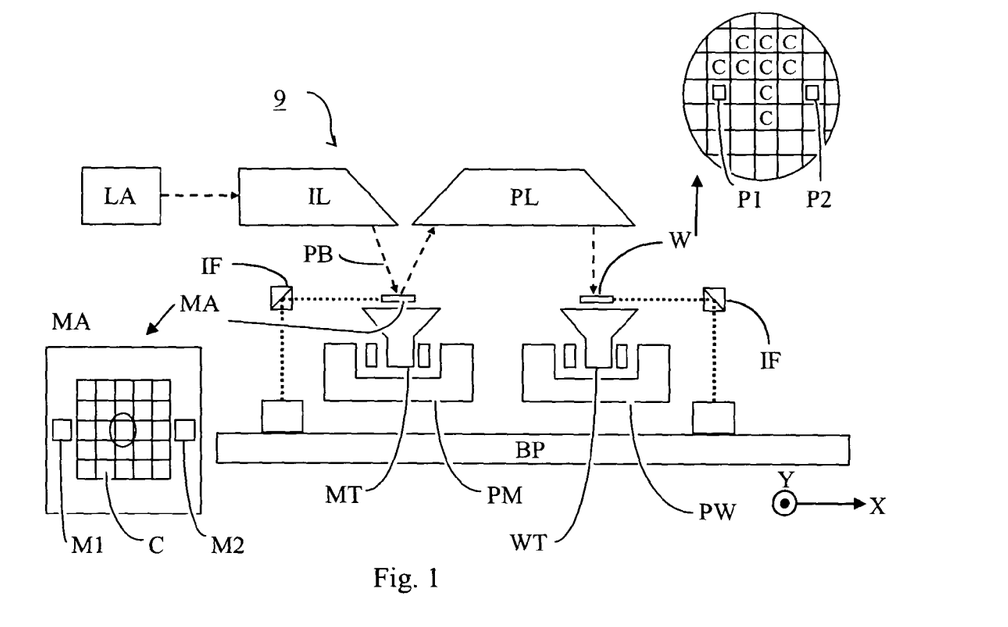
FIG. 1 depicts a lithographic apparatus according to an embodiment of the invention.

FIG. 1 schematically depicts a lithographic apparatus 9 according to a particular embodiment of the invention. The apparatus comprises:

- a radiation system IL, for supplying a projection beam PB of radiation (e.g. EUV radiation). In this particular case, the radiation system also comprises a radiation source LA;
- a first object table (mask table) MT provided with a mask holder for holding a mask MA (e.g. a reticle), and connected to first positioning means PM for accurately positioning the mask with respect to item PL;
- a second object table (substrate table) WT provided with a substrate holder for holding a substrate W (e.g. a resist-coated silicon wafer), and connected to second positioning means PW for accurately positioning the substrate with respect to item PL; and
- a projection system ("lens") PL (e.g. a mirror system) for imaging an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example (with a transmissive mask). Alternatively, the apparatus may employ another kind of patterning device, such as a programmable mirror array of a type as referred to above.

The source LA (e.g. a plasma source) produces a beam of radiation. This beam is fed into an illumination system (illuminator) IL, either directly or after having traversed conditioning means, such as a beam expander, for example. The illuminator IL may comprise adjusting means for setting the outer and/or inner radial extent (commonly referred to as σ-outer and σ-inner, respectively) of the intensity distribution in the beam. In addition, it will generally comprise various other components, such as an integrator and a condenser. In this way, the beam PB impinging on the mask MA has a desired uniformity and intensity distribution in its cross-section.

It should be noted with regard to FIG. 1 that the source LA may be within the housing of the lithographic apparatus (as is often the case when the source LA is a mercury lamp, for example), but that it may also be remote from the lithographic apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having been selectively reflected by the mask MA, the beam PB passes through the projection system PL, which focuses the beam PB onto a target portion C of the substrate W. With the aid of the second positioning means PW (and interferometric measuring means IF), the substrate table WT can be moved accurately, e.g. so as to position different target portions C in the path of the beam PB. Similarly, the first positioning means PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT is kept essentially stationary, and an entire mask image is projected at one time (i.e. a single "flash") onto a target portion C. The substrate table WT is then shifted in the x and/or y directions so that a different target portion C can be irradiated by the beam PB; and 2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
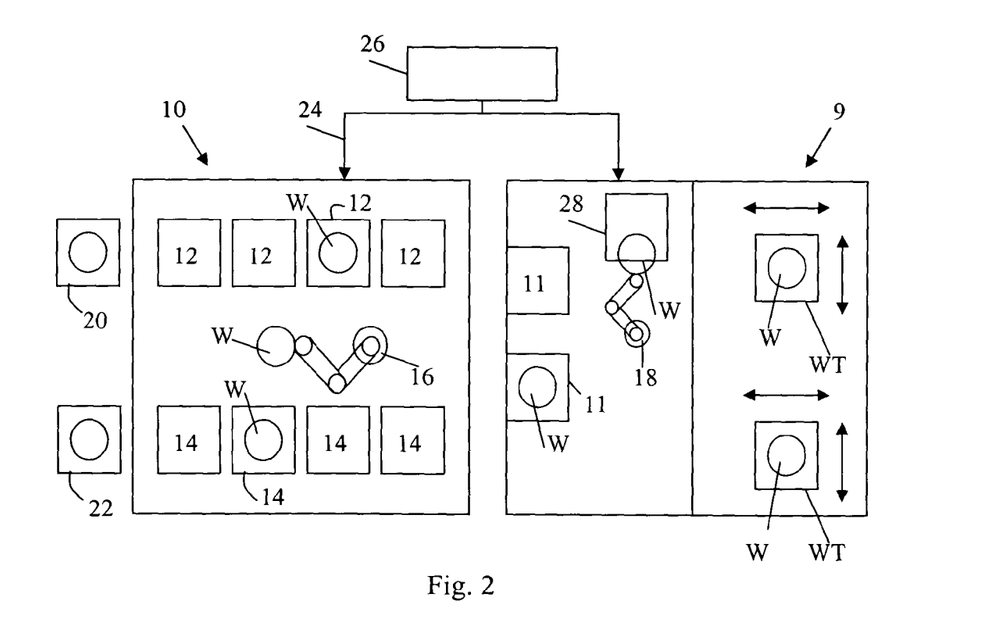
FIG. 2 depicts a schematic top view of a substrate processing system comprising a lithographic apparatus and a track according to an embodiment of the invention.

FIG. 2 depicts a schematic view of the handling processes of a substrate W in a substrate processing system. The substrate processing system as shown in FIG. 2 comprises two main parts: the track 10 and the lithographic apparatus 9, as described, for example, with reference to FIG. 1. Substrates W can be moved from the track 10 to the lithographic apparatus 9 and vice versa through a substrate handler port 11, of which two are shown in FIG. 2. The track 10 and the lithographic apparatus 9 are also shown connected to each other by a communications channel 24 and respectively to a processing unit 26. The communications channel 24 facilitates transfer of information between the track 10 and the lithographic apparatus 9. In an embodiment, the communications channel 24 also facilitates transfer of information between the processing unit 26 and the track 10 and between the processing unit 26 and the lithographic apparatus 9. The processing unit 26 typically comprises a microprocessor and appropriate software and will be described in more detail below. The processing unit 26 is not required if the track 10 and/or the lithographic apparatus 9 have a processing unit that can provide the capabilities of the processing unit 26 as described in more detail below. In an alternative, not shown in FIG. 2, the processing unit 26 may be unconnected to the lithographic apparatus 9 or the track 10.

The substrates W are placed in track process stations, of which eight are shown in FIG. 2. Four of these process stations are coaters 12 and four of these process stations are developers 14. In the coaters 12, the substrates W are coated with resist and in the developers 14 the exposed resist on the substrates are developed. Other processes can be carried out at the coaters, developers or other process stations (not shown) as will be known to a person skilled in the art.

The substrates W can be taken in and out of a process station 12,14 by a first substrate handler 16 positioned in the track 10. As an example, the first substrate handler 16 can obtain a substrate W from a coater 12 and then deliver the substrate W to a substrate handler port 11. Similarly, the first substrate handler 16 can obtain a substrate W from a substrate handler port 11 and then deliver the substrate W to a developer 14. The first substrate handler 16 can also take a substrate W from a track input port 20 and deliver it to a process station 12, 14. Similarly, the first substrate handler 16 can also take a substrate W from a process station 12, 14 and deliver it to a track output port 22. The track input port and track output port can be one and the same port or a plurality of ports. In an embodiment, the track input port and/or the track output port can be a Front Opening Unified Pod (FOUP), which is a container used to hold up to 25 substrates and which typically comprises a lot.

A second substrate handler 18, positioned in the lithographic apparatus 9, transports a substrate W within the lithographic apparatus 9. As an example, the second substrate handler 18 can obtain the substrate W from a substrate handler port 11 and then deliver the substrate W to a pre-aligner 28 and/or to a substrate table WT. The pre-aligner 28 is used, for example, to accurately control the position of the substrate W with respect to the second substrate handler 18. A substrate table WT, of which two are shown in FIG. 2, can be positioned (for example, as indicated by the arrows), in order to move the substrate W during an exposure and/or alignment procedure. The second substrate handler 18 can also obtain the substrate W from a substrate table WT and transport it to a substrate handler port 11.

In an embodiment, the processing unit has or has access to information on the lots and types of lots to be introduced into a part of the substrate processing system. Such information can include details on the particular recipe associated with a lot and the order of lots being introduced into the part of the substrate processing system. As described in more detail below, the processing unit can also determine the order of lots to be introduced into the part of the substrate processing system. Further, the processing unit can provide information about the ordering of lots and lot recipes to be introduced into the part of the substrate processing system to an operator and/or to a device that controls introduction of the lots into the part of the substrate processing system. Optionally, the processing unit can control the order of introduction of lots into the part of the substrate processing system.

Figure 3A:
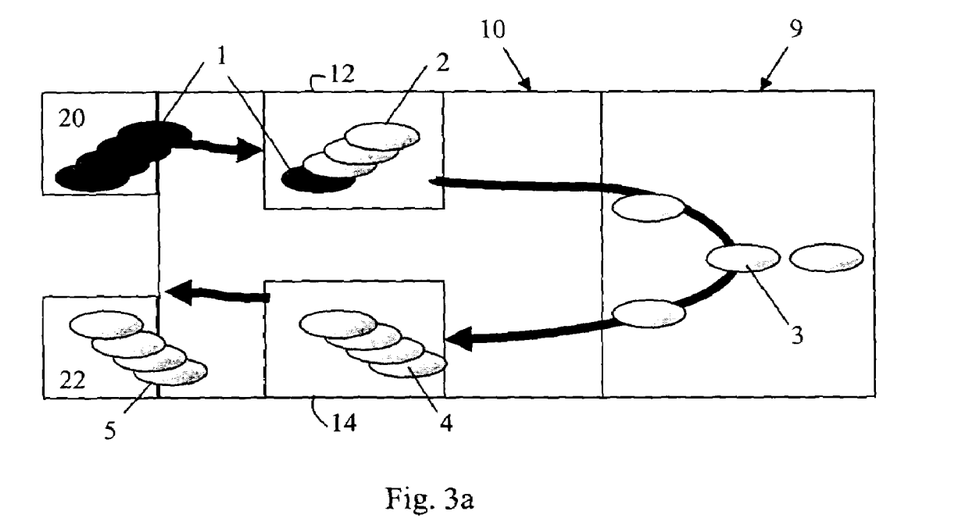
FIGS. 3a and 3b depict a schematic flow of substrates through a substrate processing system according to an embodiment of the invention.
Figure 3B:
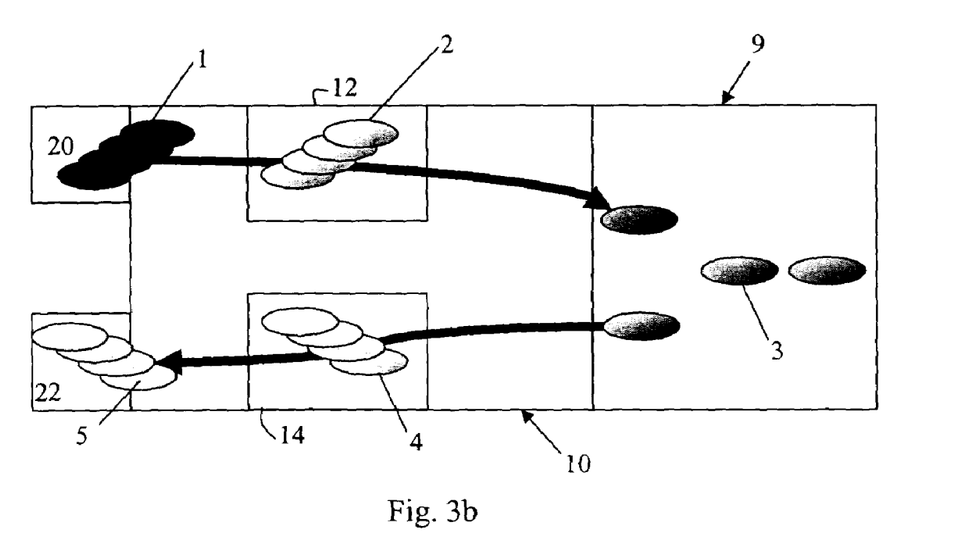

FIGS. 3a and 3b depict a schematic flow of substrates through a substrate processing system according to an embodiment of the invention. One or more substrates comprising a single lot (although a plurality of substrates can comprise more than one lot) are provided to track input port 20 and flow towards coater 12 of the track 10. After the coater 12, the lot flows toward the lithographic apparatus 9 where the substrate(s) are exposed. After completion of exposure, the lot flows towards the developer 14 and then out of the track 10 through track output port 22. After each lot is introduced into the substrate processing system, another lot can be introduced thereafter in effect resulting in a series of lots (and substrates) flowing through the substrate processing system for substrate processing.

In FIG. 3a, an example of the effect of different lot types affecting the flow of lots through a substrate processing system is shown. In this example, a plurality of the substrates of lot 1 of lot type A (lot type A being represented by the dark shading) are in the track input port 20 and one of the substrates of lot 1 of lot type A is in the coaters 12 of the track 10. Further, lots 2, 3, 4 and 5 of lot type B (lot type B being represented by the light shading) are respectively in the coaters 12 of the track, lithographic apparatus 9, the developers 14 of the track, and the track output port 22. As indicated by the arrows, the substrates of the various lots flow through the substrate processing system resulting in the movement of the lots through the substrate processing system. In this example, lot type A has a certain recipe, which defines a setup of the process steps, equipment, etc. for the substrates of the lot of that type and also establishes a rate for substrate processing of those substrates. Lot type B has another recipe, which defines a different setup of the process steps, equipment, etc. for the substrates of the lot of that type and also establishes a different rate for substrate processing of those substrates.

Due in part to the physical constraints of the track 10, the rate of substrate processing in the track is typically limited to the lowest rate of substrate processing associated with a substrate in the track. Referring then to FIG. 3a, the rate of substrate processing of track 10 is limited to the lower of the substrate processing rates of lot type A and lot type B since substrates from both lot types are in the track. So, even if lot type B has a higher rate of substrate processing than lot type A, the rate of substrate processing in the track 10 is limited to the rate associated with lot type A, although only one substrate of lot type A is in the track (i.e., one substrate of lot 1). The result is that a slow lot will slow down the track from the moment it enters the track (slowing down previously started lots) until it leaves the track (slowing down lots started later).

In FIG. 3b, another example of the effect of different lot types affecting the flow of lots through the substrate processing system is shown. In this example, lot 1 of lot type A (lot type A being represented by the dark shading) is in the track input port 20. Lot 2 of lot type B (lot type B being represented by the light shading) is in the coaters 12 of the track 10. Lot 3 of lot type A is in the lithographic apparatus 9. And, lots 4 and 5 of lot type B are respectively in the developers 14 of the track and the track output port 22. As indicated by the arrows, the substrates of the various lots flow through the substrate processing system resulting in the movement of the lots through the substrate processing system. In this example, lot type A has a certain recipe, which defines a setup of the process steps, equipment, etc. for the substrates of the lot of that type and also establishes a rate for substrate processing of those substrates. Lot type B has another recipe, which defines a different setup of the process steps, equipment, etc. for the substrates of the lot of that type and also establishes a different rate for substrate processing of those substrates.

Changing the setup of process steps, equipment, etc. of all or a portion of a substrate processing system in accordance with a different recipe can take time. Referring then to FIG. 3b, track 10 is set-up to handle substrates of lot type B (lots 2 and 4). However, as will be apparent, shortly substrates of lot type A (lot 1) will enter into the track 10 from the track input port 20. Accordingly, a certain amount time will be required to set-up at least part of the track 10, namely the coaters 12, to handle the substrates of lot type A. Similarly, substrates of lot type A (lot 3) will shortly enter into the track 10 from the lithographic apparatus 9, requiring a certain amount time to set-up at least part of the track 10, namely the developers 14, to handle the substrates of lot type A. Furthermore, after lot 3 has passed through the developers 14, a certain amount of time will be required again to change the setup of at least part of the track 10, namely the developers 14, from those of lot type A to those of lot type B in order to handle lot 2 after it passes through the lithographic apparatus 9.

As can then be understood from FIGS. 3a and 3b, substrate processing in the substrate processing system can lose productivity due to the reduction of the substrate processing rate and/or delay resulting from changing the setup of all or part of the substrate processing system. Accordingly, it would be advantageous to order the introduction of particular lots into a part of the substrate processing system so as to reduce or eliminate such lost productivity. This could improve overall productivity of the substrate processing system.

According to an embodiment of the invention, a plurality of substrate lots to be introduced into a part of the substrate processing system are evaluated to determine whether it would be beneficial to change the order in which the lots are introduced into, and thus processed in, the substrate processing system. In particular, the lot type of each of the plurality of lots could be evaluated to determine whether one or more lots of a certain lot type should be entered into a part of the substrate processing system in advance of one or more lots of another lot type. In addition or alternatively, that plurality of lots could be evaluated to determine whether one or more lots of a certain type can be bunched together, i.e., ordered consecutively. In each case, the evaluation can take into consideration reducing or eliminating the lowering of the substrate processing rate (or increasing of the substrate processing time) caused by the processing of substrates of different lot types in a part of the substrate processing system and/or reducing or eliminating the processing time resulting from changing the setup of a part of the substrate processing system due to the processing of different lot types in the part of the substrate processing system. In accordance with the evaluation, an appropriate order of the plurality of lots can be applied to the plurality of lots in the queue of lots to be introduced to the part of the substrate processing system.

More specifically, a rate of processing and/or a time of processing associated with a plurality of substrate lots to be introduced into a part of the substrate processing system can be obtained (e.g., calculated, read from a table, requested from a database or a part of the substrate processing system, etc.). With such information, an order of introduction of the plurality of substrate lots into the part of the substrate processing system can be determined to increase the rate of processing and/or decrease the time of processing of the plurality of substrate lots. The order of introduction can be then supplied to, for example, a host computer for the substrate processing system, a part of the substrate processing system (such as the track and/or lithographic apparatus), a device that interacts with the substrate processing system (e.g., a device that delivers lots to and/or stores lots for the substrate processing system such as a FOUP handler) or a user so that the order of introduction can be applied to the lots to be introduced into the part of the substrate processing system.

So, in an implementation, a processing unit can determine per lot type of a plurality of lots in a queue of lots to be introduced into a part of the substrate processing system what changes in setup, if any, are required in that or other parts of the substrate processing system to handle another lot type of the plurality of lots. The time of processing associated with changing a setup of a part of the substrate processing system handling one lot type of the plurality of lots to handle another lot type of the plurality of lots (and hence associated with the plurality of lots generally) is obtained. With the processing times, an order of the introduction of lots into the substrate processing system with the least (or at least lower) processing time due to setup changes can be derived and then applied. Consider an example lot queue that comprises 4 lots of 3 different lot types: lot 1—type A, lot 2—type B, lot 3—type A, and lot 4—type C. Since lots 1 and 3 are of the same lot type (lot type A), they would have the same setup. Hence, re-ordering the 4 lots in the queue into the order lot 1, lot 3, lot 2 and lot 4 could result in less time lost to changing of the setup of the substrate processing system. Similar time savings can be realized by consecutively ordering lot types that share one or more of the same setup settings and/or configurations.

In an example application of this implementation, the processing unit can evaluate a plurality of lots to be introduced into the substrate processing system to determine the different recipes in the plurality of lots. Then for each of the different recipes, the processing unit can determine from the recipe what changes in setup, if any, are required for the lithographic apparatus of the substrate processing system (e.g., mask, annular/dipole/quadrupole illumination, illumination settings, etc.) and/or what changes in setup, if any, are required for the track of the substrate processing system (e.g., bake plate temperature, coater modules required, resist types, etc.) to handle another recipe of the plurality of lots. The processing unit can then apply a model to obtain the processing times, associated with these changes, caused by the various transitions from one recipe to another recipe. The information in the model used to obtain these times of processing can be, for example, pre-programmed in the processing unit and/or supplied by the lithographic apparatus and/or the track. Further, the model can be, for example, a simple look-up engine of pre-determined processing times associated with recipe transitions or a calculator that combines recipe information with track and/or lithographic apparatus parameters, settings, etc. to calculate the processing time of recipe transitions.

With the obtained processing times of the recipe transitions, an order can be determined by selecting the order of the plurality of lots having the lowest processing time (or at least a lower processing time than before re-ordering), which can be determined by selecting the lowest processing time (or at least a lower processing time than before re-ordering) of the processing times for all the order permutations of the plurality of lots. For example, consider a lot queue that comprises 4 lots of 3 different lot types: lot 1—type A, lot 2—type B, lot 3—type A, and lot 4—type C. The overall processing time associated with the recipe transitions is calculated: for the order lot 1—type A, lot 2—type B, lot 3—type A, and lot 4—type C; for the order lot 1—type A, lot 2—type B, lot 4—type C, and lot 3'type A; for the order lot 1—type A, lot 3—type A, lot 2—type B, and lot 4—type C; etc.—that is, for each permutation of lot order for the 4 lots (24 permutations). The lot order then selected is the lot order associated with the lowest overall processing time (or at least a lower processing time than the processing time before re-ordering) of those calculated processing times.

In another implementation, a processing unit can obtain the time and/or rate of processing through all or part of the substrate processing system for each lot type of a plurality of lots in the queue of lots to be introduced into the substrate processing system. The rate of processing can comprise a throughput value, e.g., number of substrates per hour. The time of processing can comprise a cycle time, e.g., number of seconds to process a lot. Having the information on these times and/or rates of processing associated with the plurality of lots, the plurality of lots in the queue can be ordered to increase the overall rate of processing of the plurality of lots in the queue and/or to reduce the overall time of processing of the plurality of lots in the queue (compared to the rate and/or time of processing of the plurality of lots before re-ordering). In a first variant, the ordering can comprise sorting the plurality of lots in the queue, for example, so that the difference between throughput value or cycle times between consecutive lots is reduced. For example, consider lot types that have 3 different rates of processing—Fast (F), Medium (M) and Slow (S). A lot queue may comprise 5 lots in the following order: F-S-F-S-M. These lots will all run at an average rate of processing close to the slowest lot S. By sorting the lots to either F-F-M-S-S or S-S-M-F-F the average rate of each lot is much closer to its theoretical rate. In a second variant, the ordering can comprise selecting the order of the plurality of lots having the lowest overall processing time or rate (or at least a lower processing time or rate than the processing time or rate before re-ordering), which can be determined by selecting the lowest processing time or rate (or at least a lower processing time or rate than the processing time or rate before re-ordering) of the processing times or rates for all the order permutations of the plurality of lots. For example, consider a lot queue comprising 5 lots in the following order: 1-2-3-4-5. According to this variant, the overall processing time or rate is obtained for lot order 1-2-3-4-5, for lot order 1-2-3-5-4, for lot order 1-2-4-3-5, etc.—that is, for each permutation of lot order for the 5 lots (120 permutations). The lot order then selected is the lot order associated with the lowest processing time or rate (or at least a lower processing time or rate than the processing time or rate before re-ordering) of those modeled processing times or rates.

In an example application of this implementation, the processing unit can evaluate a plurality of lots to be introduced into the substrate processing system to determine the different recipes in the plurality of lots. For each of the different recipes, the processing unit can obtain, from the recipe and lithographic apparatus and/or track setup, the rate of processing and/or the time of processing for each recipe through the track and/or lithographic apparatus of the substrate processing system. As an example, knowing the number of modules in the track and/or lithographic apparatus used according to the recipe, the process time of each module and the number of process steps, the processing unit can apply a model to calculate a maximum throughput value or a minimum cycle time for each recipe. The information used to obtain the rate and/or time of processing can be, for example, pre-programmed in the processing unit and/or supplied by the lithographic apparatus and/or the track. Further, the processing unit can have, for example, a simple look-up engine of pre-determined processing times or rates associated with flow of a recipe through the track and/or lithographic apparatus or a calculator that combines recipe information with track and/or lithographic apparatus parameters, settings, etc. to calculate the processing times and/or rates.

With the obtained processing times and/or rates, an appropriate order of lots can be determined. For example, the order of lots can be determined by sorting the order of lots by the rate or time of processing or by selecting the order of the plurality of lots having the lowest processing time or rate (or at least a lower processing time or rate than before re-ordering), which can be determined by selecting the lowest processing time or rate (or at least a lower processing time or rate than before re-ordering) of the processing times or rates for all the order permutations of the plurality of lots.

Figure 4A:
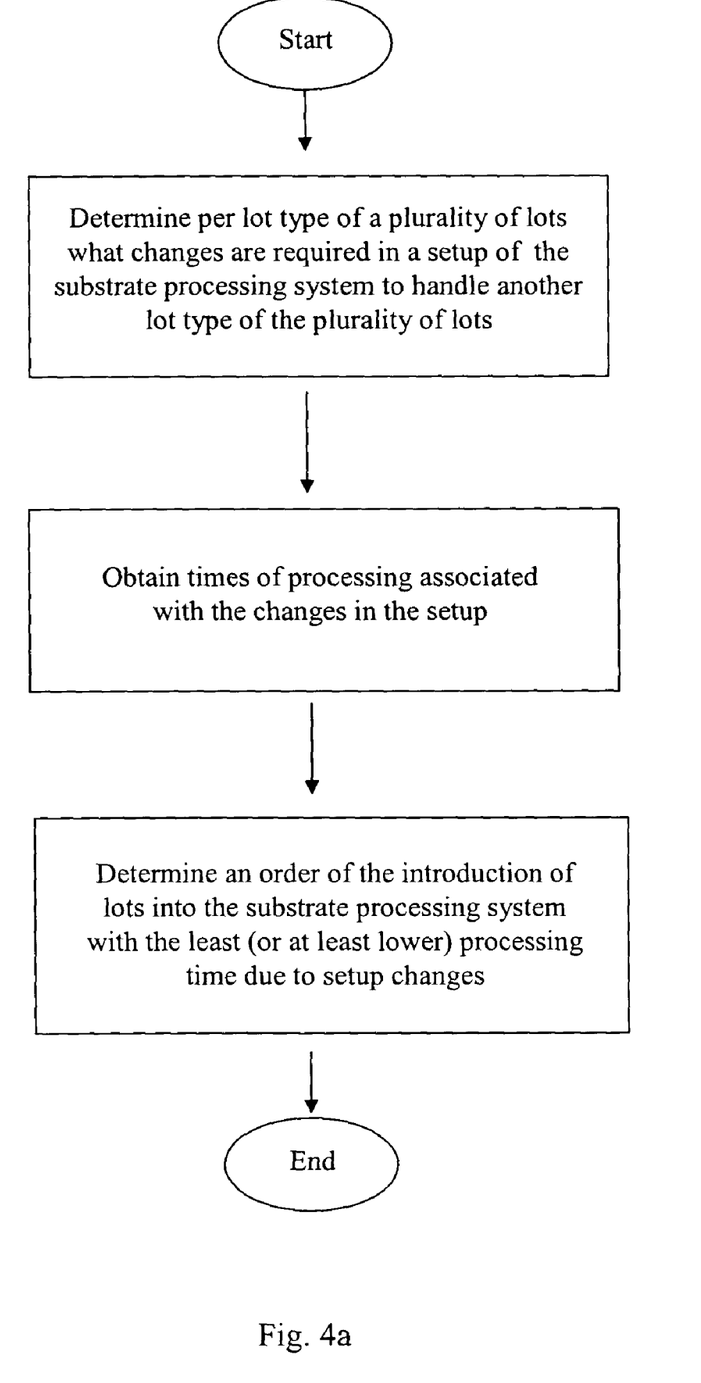
FIGS. 4a to 4b depict flowcharts of evaluation and ordering of lots to be introduced into a substrate processing system according to embodiments of the invention.
Figure 4B:
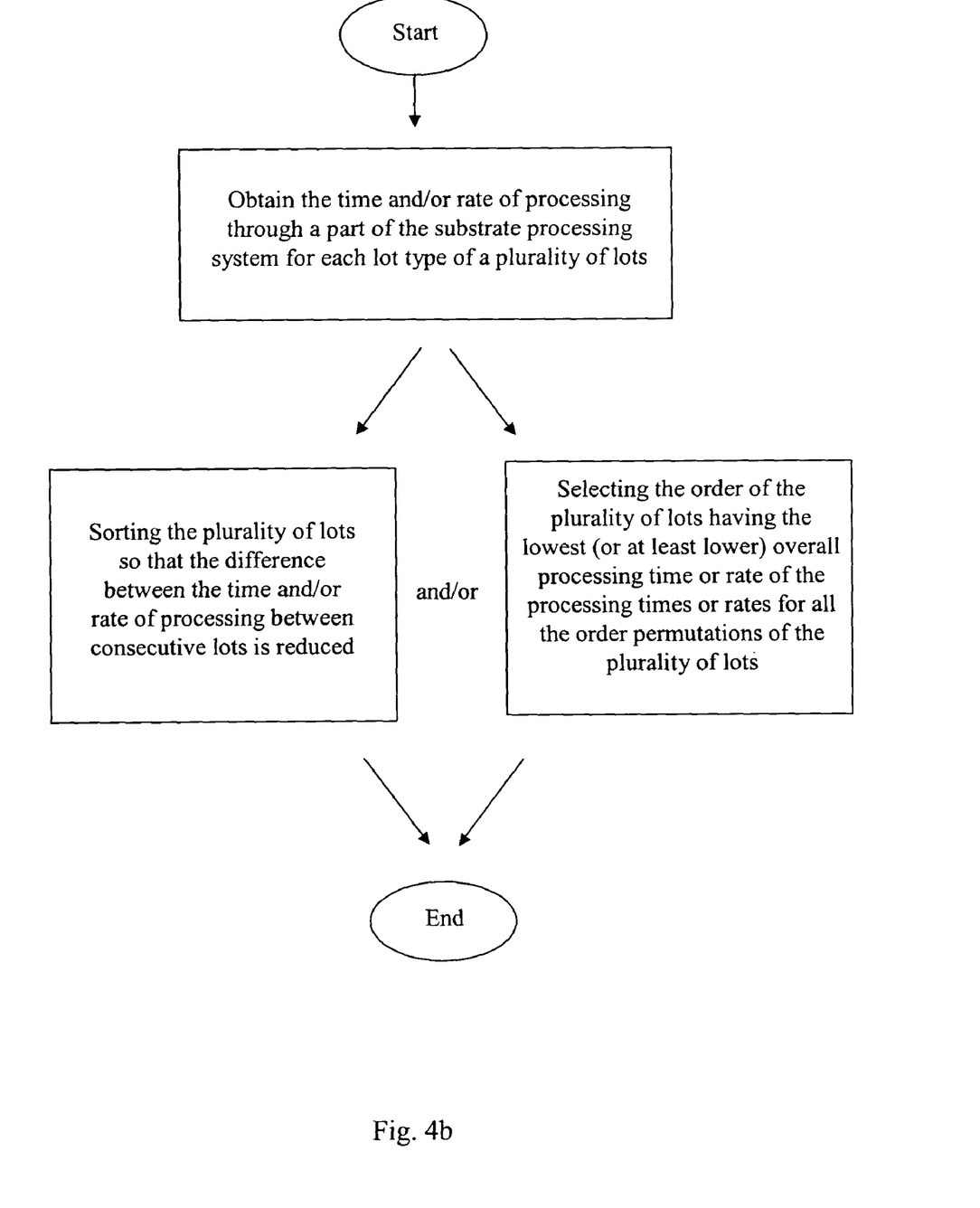

FIGS. 4a and 4b depict flowcharts of these respective implementations of an embodiment of the invention. Further, these implementations may be combined together. A result of such a combination could be a more comprehensive order of the lots to provide improved processing of substrates in the substrate processing system. For example, a processing unit can obtain per lot type of a plurality of lots in a queue of lots to be introduced into a part of the substrate processing system the time and/or rate of processing associated with the processing of that lot type through all or part of the substrate processing system and associated with changes in substrate processing system setup that are required to handle another lot type of the plurality of lots. With the obtained processing times and/or rates, an appropriate order of lots can be determined. For example, the order of lots can be determined by selecting the order of the plurality of lots having the lowest processing time or rate (or at least a lower processing time or rate than before re-ordering), which can be determined by selecting the lowest processing time or rate (or at least a lower processing time or rate than before re-ordering) of the processing times or rates for all the order permutations of the plurality of lots. In this case, the processing times or rates include the times and rates attributed to processing the lot type through all or part of the substrate processing system and attributed to changes in substrate processing system setup that are required to handle another lot type of the plurality of lots.

Further, it should be noted that in some cases rates and/or times of processing per lot type/recipe may not be uniform among all lots having the same lot type/recipe. For example, activities specific to a particular substrate of a lot may apply such as a metrology activity. In that case, the rate or time of processing cannot apply to all lots of the same type/recipe due to such per substrate variances in certain lots. Accordingly, in an extension of the above-described embodiments and implementations, such per substrate activities may be accounted for in the determination of lot order. Similarly, certain pre-conditions and/or post-conditions can affect the ordering of lots. Supply of materials to or performance of actions in a part of the substrate processing system, for instance, may impact an otherwise appropriate lot order. For example, substrates of a lot may not be ready for introduction into the part of the substrate processing system, processing materials (e.g. a resist) may not have been supplied to a part of the substrate processing system, a calibration or other test may not have been performed, etc., all of which can cause slowing of processing of lots. Accordingly, in an extension of the above-described embodiments and implementations, pre-conditions and/or post-conditions may be accounted for in the determination of the lot order.

According to an embodiment, the processing unit may comprise a software scheduler to order and schedule the introduction of lots into a part of the substrate processing system. With information about the possible lots that can be introduced into a part of the substrate processing system (i.e., lots in the queue), a plurality of lots can be ordered and scheduled through the scheduler to be introduced into the part of the substrate processing system so as to improve the overall rate and/or time of processing of those lots.

In this embodiment, the scheduler has or receives information about the lots that can be introduced into the part of the substrate processing system. For example, the scheduler may have or receive information regarding lots that can be introduced into the substrate processing system, i.e., that are in the queue. Such lot queue information can include information about the number and identity of lots that can be introduced into the substrate processing system, the types of those lots and/or recipe associated with each lot, the number of substrates in each lot, etc. The scheduler further may have or receive information about the processing of lots in the substrate processing system. Such lot processing information can include information about the setup of one or more parts of the substrate processing system (e.g., mask, annular/dipole/quadrupole illumination, and/or illumination settings of the lithographic apparatus, bake plate temperature, coater modules required and resist types of the track, etc.), data about the current status of substrate processing in a part of the substrate processing system, processing rates or times associated with modules in a part of the substrate processing system, etc. Such lot queue and/or lot processing information may be, for instance, provided by a host computer for the substrate processing system, provided by a part of the substrate processing system (such as the track and/or lithographic apparatus), provided by a device that interacts with the substrate processing system (e.g., a device that delivers lots to and/or stores lots for the substrate processing system such as a FOUP handler) or provided by a user.

With all the necessary information, the scheduler can determine an appropriate lot order as described in the above embodiments, implementations and/or their combinations. Of course, any other appropriate ordering algorithm may be applied to order the lots.

Once the lot order has been determined, the scheduler can schedule the introduction of lots into a part of the substrate processing system, such as the track or lithographic apparatus. For example, the order of introduction can be supplied to a host computer for the substrate processing system, a part of the substrate processing system (such as the track and/or lithographic apparatus), a device that interacts with the substrate processing system (e.g., a device that delivers lots to and/or stores lots for the substrate processing system such as a FOUP handler) or a user so that the order of introduction can be applied to the lots to be introduced into the part of the substrate processing system. In an implementation, one or more parts of the substrate processing system and/or a device that interacts with the substrate processing system allows the scheduler to activate the introduction of lots into the substrate processing system.

As noted earlier, the processing unit 26 typically comprises a microprocessor and appropriate software. The processing unit 26 is not required if the track 10 and/or the lithographic apparatus 9 have a processing unit that can provide the capabilities of the processing unit 26. Processing unit 26 will usually comprises software to perform the methods described above. As noted above, processing unit 26 may be stand-alone. Moreover, processing unit 26 may comprises multiple microprocessors and/or modules of software distributed on various substrate processing equipment or other devices. Similarly, the scheduler may implemented in a stand-alone manner, as part of the track and/or lithographic apparatus of the substrate processing system, in multiple modules distributed on various substrate processing equipment or other devices, etc.

More generally, each step of the method may be executed on any general computer, such as a mainframe computer, personal computer or the like and pursuant to one or more, or a part of one or more, program modules or objects generated from any programming language, such as C++, Java, Fortran or the like. And still further, each step, or a file or object or the like implementing each step, may be executed by special purpose hardware or a circuit module designed for that purpose. For example, the invention may be implemented as a firmware program loaded into non-volatile storage or a software program loaded from or into a data storage medium as machine-readable code, such code being instructions executable by an array of logic elements such as a microprocessor or other digital signal processing unit.

The invention may be implemented as an article of manufacture comprising a computer usable medium having computer readable program code means therein for executing the method steps of the invention, a program storage device readable by a machine, tangibly embodying a program of instructions executable by a machine to perform the method steps of the invention, a computer program product, or an article of manufacture comprising a computer usable medium having computer readable program code means therein, the computer readable program code means in said computer program product comprising computer readable code means for causing a computer to execute the steps of the invention. Such an article of manufacture, program storage device, or computer program product may include, but is not limited to, CD-ROMs, diskettes, tapes, hard drives, computer system memory (e.g. RAM or ROM) and/or the electronic, magnetic, optical, biological or other similar embodiment of the program (including, but not limited to, a carrier wave modulated, or otherwise manipulated, to convey instructions that can be read, demodulated/decoded and executed by a computer). Indeed, the article of manufacture, program storage device or computer program product may include any solid or fluid transmission medium, magnetic or optical, or the like, for storing or transmitting signals readable by a machine for controlling the operation of a general or special purpose computer according to the method of the invention and/or to structure its components in accordance with a system of the invention.

The invention may also be implemented in a system. A system may comprise a computer that includes a processor and a memory device and optionally, a storage device, an output device such as a video display and/or an input device such as a keyboard or computer mouse. Moreover, a system may comprise an interconnected network of computers. Computers may equally be in stand-alone form (such as the traditional desktop personal computer) or integrated into another apparatus (such a cellular telephone).

The system may be specially constructed for the required purposes to perform, for example, the method steps of the invention or it may comprise one or more general purpose computers as selectively activated or reconfigured by a computer program in accordance with the teachings herein stored in the computer(s). The system could also be implemented in whole or in part as a hard-wired circuit or as a circuit configuration fabricated into an application-specific integrated circuit. The invention presented herein is not inherently related to a particular computer system or other apparatus. The required structure for a variety of these systems will appear from the description given.

In the case of diagrams depicted herein, they are provided by way of example. There may be variations to these diagrams or the steps (or operations) described herein without departing from the spirit of the invention. For instance, in certain cases, the steps may be performed in differing order, or steps may be added, deleted or modified. All of these variations are considered to comprise part of the present invention as recited in the appended claims.

While specific embodiments of the invention have been described above, it will be appreciated that the invention may be practiced otherwise than as described. The description is not intended to limit the invention.

What is claimed is:

1. A computer program product for processing of substrates in at least a part of a substrate processing system, comprising:
    software code configured to obtain at least one of a rate of processing and a time of processing associated with a plurality of substrate lots to be introduced into a part of the substrate processing system; and
    software code configured to determine an order of introduction of the plurality of substrate lots into the part of the substrate processing system to at least one of increase the rate of processing and decrease the time of processing of the plurality of substrate lots.

2. The computer program product according to claim 1, wherein said code configured to obtain at least one of the rate of processing and the time of processing comprises code configured to obtain, for each lot type of the plurality of lots, the time of processing required to change a setup of a part of the substrate processing system handling that lot type to handle each of one or more other lot types of the plurality of lots.

3. The computer program product according to claim 1, wherein said code configured to determine an order comprises code configured to determine an order of the plurality of lots with the least processing time to change a setup of a part of the substrate processing system for the plurality of lots.

4. The computer program product according to claim 1, wherein said code configured to obtain at least one of the rate of processing and the time of processing comprises code configured to obtain at least one of the rate of processing and the time of processing of each lot type of the plurality of lots through a part of the substrate processing system.

5. The computer program product according to claim 1, wherein said code configured to determine an order comprises code configured to sort the order of the plurality of lots so that the difference between the at least one of rate of processing and time of processing of consecutive lots is reduced.

6. The computer program product according to claim 1, wherein said code configured to determine an order comprises code configured to select the order of the plurality of lots having the lowest overall processing time or rate of the processing times or rates for all the order permutations of the plurality of lots.

7. The computer program product according to claim 1, wherein:
    said code configured to obtain at least one of the rate of processing and the time of processing comprises code configured to obtain, for each lot type of the plurality of lots, the time of processing required to change a setup of a part of the substrate processing system handling that lot type to handle each of one or more other lot types of the plurality of lots and to obtain at least one of the rate of processing and time of processing of each lot type of the plurality of lots through a part of the substrate processing system; and
    said code configured to determine an order comprises code configured to select the order of the plurality of lots having the lowest overall processing time or rate of the processing times or rates for all the order permutations of the plurality of lots.

8. The computer program product according to claim 1, wherein said code configured to obtain at least one of the rate of processing and the time of processing comprises code configured to calculate the at least one of the rate of processing and time of processing using a recipe associated with one or more lots of the plurality of lots and using setup information regarding the part of the substrate processing system.

9. The computer program product according to claim 1, wherein said substrate processing system comprises a lithographic apparatus and a track.

10. The computer program product according to claim 1, wherein said computer program product is operated externally from a lithographic apparatus and a track.

11. The computer program product according to claim 1, further comprising code configured to schedule the introduction of the plurality of lots into the part of the substrate processing system according to the order.

12. A method for processing of substrates in at least a part of a substrate processing system, comprising:
    obtaining, using a processing unit, at least one of a rate of processing and a time of processing associated with a plurality of substrate lots to be introduced into a part of the substrate processing system; and
    determining, using the processing unit, an order of introduction of the plurality of substrate lots into the part of the substrate processing system to at least one of increase the rate of processing and decrease the time of processing of the plurality of substrate lots.

13. The method according to claim 12, wherein said obtaining comprises obtaining, for each lot type of the plurality of lots, the time of processing required to change a setup of a part of the substrate processing system handling that lot type to handle each of one or more other lot types of the plurality of lots.

14. The method according to claim 12, wherein said determining an order comprises determining an order of the plurality of lots with the least processing time to change a setup of a part of the substrate processing system for the plurality of lots.

15. The method according to claim 12, wherein said obtaining comprises obtaining at least one of the rate of processing and the time of processing of each lot type of the plurality of lots through a part of the substrate processing system.

16. The method according to claim 12, wherein said determining an order comprises sorting the order of the plurality of lots so that the difference between the at least one of rate of processing and time of processing of consecutive lots is reduced.

17. The method according to claim 12, wherein said determining an order comprises selecting the order of the plurality of lots having the lowest overall processing time or rate of the processing times or rates for all the order permutations of the plurality of lots.

18. The method according to claim 12, wherein:
said obtaining comprises obtaining, for each lot type of the plurality of lots, the time of processing required to change a setup of a part of the substrate processing system handling that lot type to handle each of one or more other lot types of the plurality of lots and obtaining at least one of the rate of processing and time of processing of each lot type of the plurality of lots through a part of the substrate processing system; and
said determining an order comprises selecting the order of the plurality of lots having the lowest overall processing time or rate of the processing times or rates for all the order permutations of the plurality of lots.

19. The method according to claim 12, wherein said substrate processing system comprises a lithographic apparatus and a track.

20. The method according to claim 12, wherein said obtaining comprises calculating the at least one of the rate of processing and time of processing using a recipe associated with one or more lots of the plurality of lots and using setup information regarding the part of the substrate processing system.

21. A lithographic apparatus comprising:
an illuminator configured to condition a beam of radiation;
a support structure configured to hold a patterning device, the patterning device configured to pattern the beam according to a desired pattern;
a substrate table configured to hold a substrate;
a projection system configured to project the patterned beam onto a target portion of the substrate; and
a processing unit configured to obtain at least one of a rate of processing and a time of processing associated with a plurality of substrate lots to be introduced into a part of a substrate processing system and to determine an order of introduction of the plurality of substrate lots into the part of the substrate processing system to at least one of increase the rate of processing and decrease the time of processing of the plurality of substrate lots.

22. The lithographic apparatus according to claim 21, wherein the processing unit is configured to calculate the at least one of the rate of processing and time of processing using a recipe associated with one or more lots of the plurality of lots and using setup information regarding the lithographic apparatus.

23. The lithographic apparatus according to claim 21, wherein:
the processing unit is configured to obtain, for each lot type of the plurality of lots, the time of processing required to change a setup of a part of the substrate processing system handling that lot type to handle each of one or more other lot types of the plurality of lots and to obtain at least one of the rate of processing and time of processing of each lot type of the plurality of lots through a part of the substrate processing system; and
the processing unit is configured to select the order of the plurality of lots having the lowest overall processing time or rate of the processing times or rates for all the order permutations of the plurality of lots.

24. A track comprising:
a coater configured to apply a layer of radiation-sensitive material to a substrate;
a developer configured to develop an exposed substrate; and
a processing unit configured to obtain at least one of a rate of processing and a time of processing associated with a plurality of substrate lots to be introduced into a part of a substrate processing system and to determine an order of introduction of the plurality of substrate lots into the part of the substrate processing system to at least one of increase the rate of processing and decrease the time of processing of the plurality of substrate lots.

25. The track according to claim 24, wherein the processing unit is configured to calculate the at least one of the rate of processing and time of processing using a recipe associated with one or more lots of the plurality of lots and using setup information regarding the track.

26. The track according to claim 24, wherein:
the processing unit is configured to obtain, for each lot type of the plurality of lots, the time of processing required to change a setup of a part of the substrate processing system handling that lot type to handle each of one or more other lot types of the plurality of lots and to obtain at least one of the rate of processing and time of processing of each lot type of the plurality of lots through a part of the substrate processing system; and
the processing unit is configured to select the order of the plurality of lots having the lowest overall processing time or rate of the processing times or rates for all the order permutations of the plurality of lots.

* * * * *